United States Patent
Gao

(10) Patent No.: US 10,925,180 B2
(45) Date of Patent: Feb. 16, 2021

(54) IT CONTAINER SYSTEM DESIGN APPROACH FOR FAST DEPLOYMENT AND HIGH COMPATIBILITY APPLICATION SCENARIOS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/292,242

(22) Filed: Mar. 4, 2019

(65) Prior Publication Data

US 2020/0288601 A1    Sep. 10, 2020

(51) Int. Cl.
*H05K 7/20* (2006.01)
*G06F 1/20* (2006.01)

(52) U.S. Cl.
CPC ........... *H05K 7/20236* (2013.01); *G06F 1/20* (2013.01); *H05K 7/2079* (2013.01); *H05K 7/20272* (2013.01)

(58) Field of Classification Search
CPC ........... H05K 7/20236; H05K 7/20272; H05K 7/2079; G06F 1/20
See application file for complete search history.

(56) References Cited

U.S. PATENT DOCUMENTS

| | | | |
|---|---|---|---|
| 9,410,751 B2* | 8/2016 | David | F28F 27/00 |
| 9,622,379 B1* | 4/2017 | Campbell | H05K 7/2039 |
| 2007/0267741 A1* | 11/2007 | Attlesey | G06F 1/20 257/714 |
| 2012/0057302 A1* | 3/2012 | Wei | H05K 7/20781 361/699 |
| 2013/0021746 A1* | 1/2013 | Campbell | H05K 7/20145 361/679.47 |
| 2013/0105120 A1* | 5/2013 | Campbell | H05K 7/203 165/104.21 |
| 2014/0133099 A1* | 5/2014 | Campbell | F28F 9/00 361/698 |
| 2014/0218858 A1* | 8/2014 | Shelnutt | G06F 1/206 361/679.31 |
| 2015/0109729 A1* | 4/2015 | Campbell | H05K 7/203 361/679.47 |
| 2015/0109730 A1* | 4/2015 | Campbell | H05K 7/20809 361/679.53 |
| 2017/0064862 A1* | 3/2017 | Miyoshi | H05K 7/203 |

(Continued)

*Primary Examiner* — Binh B Tran
*Assistant Examiner* — Michael A Matey
(74) *Attorney, Agent, or Firm* — Womble Bond Dickinson (US) LLP

(57) ABSTRACT

An IT enclosure and immersion cooling unit is disclosed. The unit comprises: an immersion cooling area to accommodate electronic devices that require cooling, the electronic devices being immersed in coolant; an heat exchanger; a coolant supply line to supply cooler coolant from the heat exchanger to the immersion cooling area; and an coolant return line to return warmer coolant from the immersion cooling area to the heat exchanger, wherein the cooler coolant absorbs heat from the electronic devices in the immersion cooling area and turns into the warmer coolant, wherein heat is extracted from the warmer coolant in the heat exchanger and transferred to external coolant, and wherein the heat exchanger, the coolant supply line, and the coolant return line are packaged within the immersion cooling unit.

12 Claims, 5 Drawing Sheets

(56) References Cited

U.S. PATENT DOCUMENTS

| | | | |
|---|---|---|---|
| 2017/0172011 A1* | 6/2017 | Chen | H05K 7/20636 |
| 2017/0265336 A1* | 9/2017 | Ichinose | H05K 7/20772 |
| 2017/0280587 A1* | 9/2017 | Watanabe | H01L 23/473 |
| 2017/0303442 A1* | 10/2017 | Smith | H05K 7/20809 |
| 2017/0332514 A1* | 11/2017 | Saito | F25D 9/00 |
| 2017/0354066 A1* | 12/2017 | Kodama | H05K 7/20818 |
| 2018/0027695 A1* | 1/2018 | Wakino | H05K 7/20772 |
| | | | 361/699 |
| 2018/0042138 A1* | 2/2018 | Campbell | H05K 7/203 |
| 2018/0070477 A1* | 3/2018 | Saito | H05K 7/20818 |
| 2018/0092243 A1* | 3/2018 | Saito | H05K 7/20 |
| 2018/0098464 A1* | 4/2018 | Ishinabe | H05K 7/20236 |
| 2018/0153058 A1* | 5/2018 | Hirai | H05K 7/20781 |
| 2018/0246550 A1* | 8/2018 | Inaba | G06F 1/206 |
| 2019/0159360 A1* | 5/2019 | Uchida | H01L 23/44 |
| 2019/0200483 A1* | 6/2019 | Tian | G06F 1/206 |
| 2019/0383559 A1* | 12/2019 | Aoki | F28D 1/0213 |

* cited by examiner

IT CONTAINER SYSTEM DESIGN APPROACH FOR FAST DEPLOYMENT AND HIGH COMPATIBILITY APPLICATION SCENARIOS

FIELD OF THE INVENTION

Embodiments of the present invention relate generally to thermal management. More particularly, embodiments of the invention relate to immersion cooling for electronic equipment.

BACKGROUND

Immersion cooling is a computer cooling practice by which computer components such as central processing units (CPUs), graphics processing units (GPUs), memory, and other electronics including complete servers are completely submerged in a thermally conductive dielectric liquid or coolant, which is then cooler through the use of a circulation system employing liquid pumps, plumbing, liquid-to-liquid heat exchangers and/or dry cooler (radiator) type coolers to reject the heat from the coolant.

Edge computing technologies are becoming more important on the market in the era of artificial intelligence (AI) and 5G. With deployment of more and more edge computing devices, hardware design can become a challenge due to the many different requirements associated with the characteristics of edge computing. The edge computing server center design becomes critical as the computing load is moved from the core data center closer to the edge, or from the cloud to the edge or somewhere closer to the edge. Conventional infrastructure, system, or hardware design approaches may not satisfy the requirements in the edge computing server room. In addition, the requirements may be different in the edge computing server center.

Several issues pertaining to immersion cooling need to be solved before immersion cooling-based solutions can be actually deployed on a mass scale, especially in scenarios where the devices may consume high power. Immersion cooling technology is a fully liquid cooling solution for IT equipment, this means the 100% heat generated by the IT equipment are extracted to the liquid. This means with immersion cooling technology, the IT enclosure can be designed as an independent unit, this satisfies edge computing requirement.

Existing immersion cooling solutions may use a coolant distribution unit (CDU) in the loop. In these designs, the primary loop connects the CDU and external heat transfer loops or cooling units, and a secondary loop connects the CDU secondary loop and the immersion tank or cabinet. Such solutions may be inflexible as they require very particular cooling infrastructure. And effective immersion cooling architecture design should be easily fitting into existing data center infrastructure or at least does not require significant modifications on the infrastructure.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
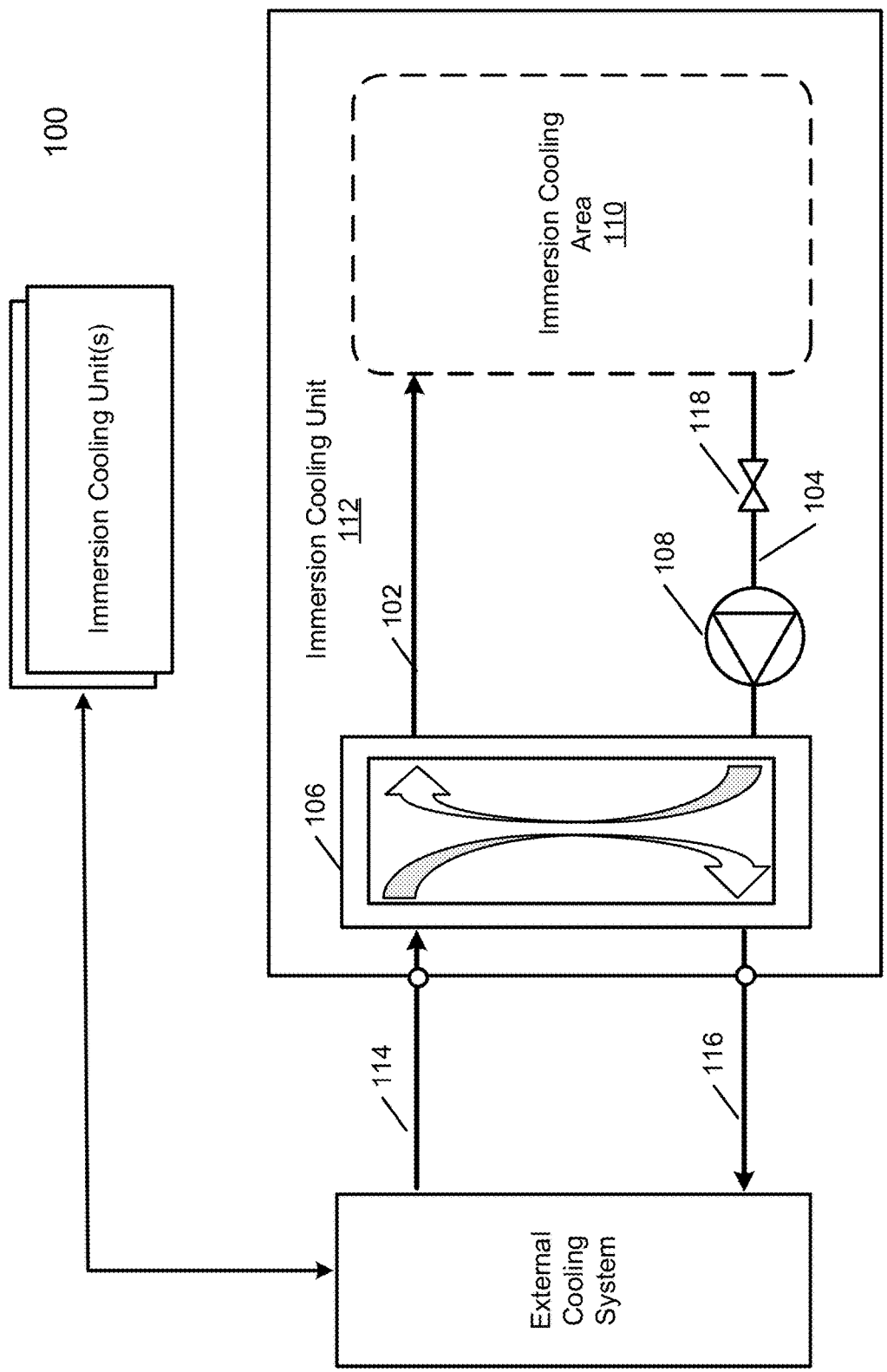
FIG. 1 is a block diagram illustrating an example of a data center system with immersion cooling according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the disclosure relate to an emersion cooling unit design for immersion cooling-based thermal management. The container may accommodate various types of electronics devices, such as CPU-based servers, GPU-based servers, storage servers, network devices, and so on. A heat exchanger for transferring the heat in the immersion coolant to external cooling media (e.g., coolant) is utilized. The heat exchanger may be packaged within the container. One or more liquid pumps may be used to facilitate the circulation of immersion coolant within the container.

The solutions described herein can be deployed quickly as no particular cooling infrastructure is required other than an external coolant supply and return system. The solutions are compatible with most of the existing data center cooling infrastructure such as a chilled water-cooling loop or a cooling water loop. No or minimum modification or retrofitting to the existing infrastructure is required. As the solutions reduce the required amount of immersion coolant, they can be deployed at a lower cost. Further, the resistance in the secondary loop is minimized, thus less energy is required for pumping the fluid, and energy efficiency is improved. The solutions enable better flow arrangement and management, and are associated with a low failure rate. The solutions can be used in scenarios where the power density is highly non-uniform.

According to one aspect of the disclosure, an immersion cooling unit used as a part of a data center cooling system includes an immersion cooling area or space to contain or store one or more electronic devices (also referred to as information technology or IT components) submerged in coolant. The immersion cooling unit further includes a heat exchanger, a coolant supply line (also referred to as a coolant supply manifold), and a coolant return line (also referred to as a coolant return manifold) coupled to the immersion cooling area. The coolant supply line is configured to receive coolant from the heat exchanger and to supply the coolant (e.g., cooler coolant) to the immersion cooling area to cool the temperature of the electronic devices therein. The coolant return line is configured to receive coolant (e.g., warmer coolant) from the immersion cooling area and to return the coolant to the heat exchanger. The coolant exchanges the heat generated from the electronic devices in the immersion cooling area. The heat exchanger is configured to exchange the heat between the coolant and the external coolant circulated from an external cooling system via a primary loop of the heat exchanger. The heat exchanger, the coolant supply and return lines, and the immersion cooling area form a secondary loop of the heat exchanger.

In one embodiment, a pump is disposed on the coolant return line to circulate the coolant and may control the flow rate of the circulation between the heat exchanger and the immersion cooling area, which transform the coolant between cooler coolant and warmer coolant via circulation. A valve may also be disposed on the coolant return line, which may be utilized to control the flow rate of the coolant to and from the heat exchanger. The heat exchanger may be a liquid-to-liquid heat exchanger. The coolant can be any type of verified thermally conductive dielectric liquid.

In one embodiment, the heat exchanger may also be submerged in the coolant. When the heat exchanger is submerged in the coolant, the entire immersion cooling loop including the supply and return loop as well as the pump and valve are submerged in the coolant. Alternatively, an immersion tank is utilized to contain the electronic devices, where the electronic devices are submerged in the coolant contained within the immersion tank. In this embodiment, the heat exchanger is coupled to the immersion tank via the coolant supply line and the coolant return line. Thus, the heat exchanger is not submerged in the coolant. Rather, the heat exchanger locates external to the immersion tank and circulates the coolant with the electronic devices within the immersion cooling tank.

According to another embodiment, the housing or container of the immersion cooling unit includes an inlet port coupled to an external coolant supply line to receive external coolant from an external cooling system into the primary loop of the heat exchanger. Similarly, the immersion cooling unit further includes an outlet port to return the external coolant back to the external cooling system from the heat exchanger. These connections form the primary loop of the heat exchanger. The immersion cooling unit is one of a number of immersion cooling units of a data center coupled to the external cooling system. Each of the immersion cooling units can be connected to or disconnected from the external cooling system individually or independently in a plug and play manner.

According to another aspect, a data center cooling system includes a number of immersion cooling units coupled to a common cooling source via a room coolant supply line or supply manifold and a room coolant return line or return manifold. Each of the immersion cooling units can be individually connected to or disconnected from the room coolant supply line and the room coolant return line in a plug and play manner. Each of the immersion cooling units includes at least some of the components or features as described above.

Referring to FIG. 1, a block diagram illustrating an example of an immersion cooling unit used as a part of a data center cooling system according to one embodiment is shown. The immersion cooling unit 112 includes an immersion cooling area or slots 110 where the electronic devices that require cooling can be installed or deposited therein. The immersion cooling unit 112 further comprises a coolant supply line 102 for supplying the coolant from a heat exchanger 106, and a coolant return line 104 for returning the coolant to the heat exchanger 106. The coolant can then fill up at least in the area 110 of the container or housing of the immersion cooling unit to cover the electronic devices. In another design, the entire immersion cooling unit is filled with coolant.

The coolant may be a thermally conductive dielectric liquid and the fluid is verified, especially its compatibility with the IT hardware, immersion cooling unit hardware materials and so on. Under normal operation conditions, the coolant may fill the immersion cooling area 110 to remove the heat generated from the electronic devices and lower the temperature of the electronic devices. An electronic device can be an IT component such as a computer server of a data center. The heat in the coolant is extracted and transferred to the external coolant in the heat exchanger 106, which is packaged within the unit 112. Thus, the heat exchanger 106 may be a liquid-to-liquid heat exchanger. A liquid pump 108 may be disposed on the coolant return line 104 to facilitate the circulation of the coolant within the unit 112. Optionally a valve 118 may be also disposed on the coolant return line 104. Thus, the coolant circulates in a closed loop, i.e., a secondary loop: the cooler coolant absorbs heat from the electronic devices in the immersion cooling area 110, and turns into warmer coolant. The warmer coolant is cooled in the heat exchanger 106, and is transformed back into cooler coolant.

An external coolant supply line or port 114 is provided to receive cooler external coolant from an external coolant source (e.g., an external heat exchanger, chiller, not shown), and an external coolant return line or port 116 is provided to return warmer external coolant to the external coolant source. The external cooling system, external coolant supply line 114, heat exchanger 106, and external coolant return line 116 form a primary loop with respect to heat exchanger 106. In some embodiments, more than one external coolant supply lines/ports 114 and return lines/ports 116 may be provided.

Figure 2:
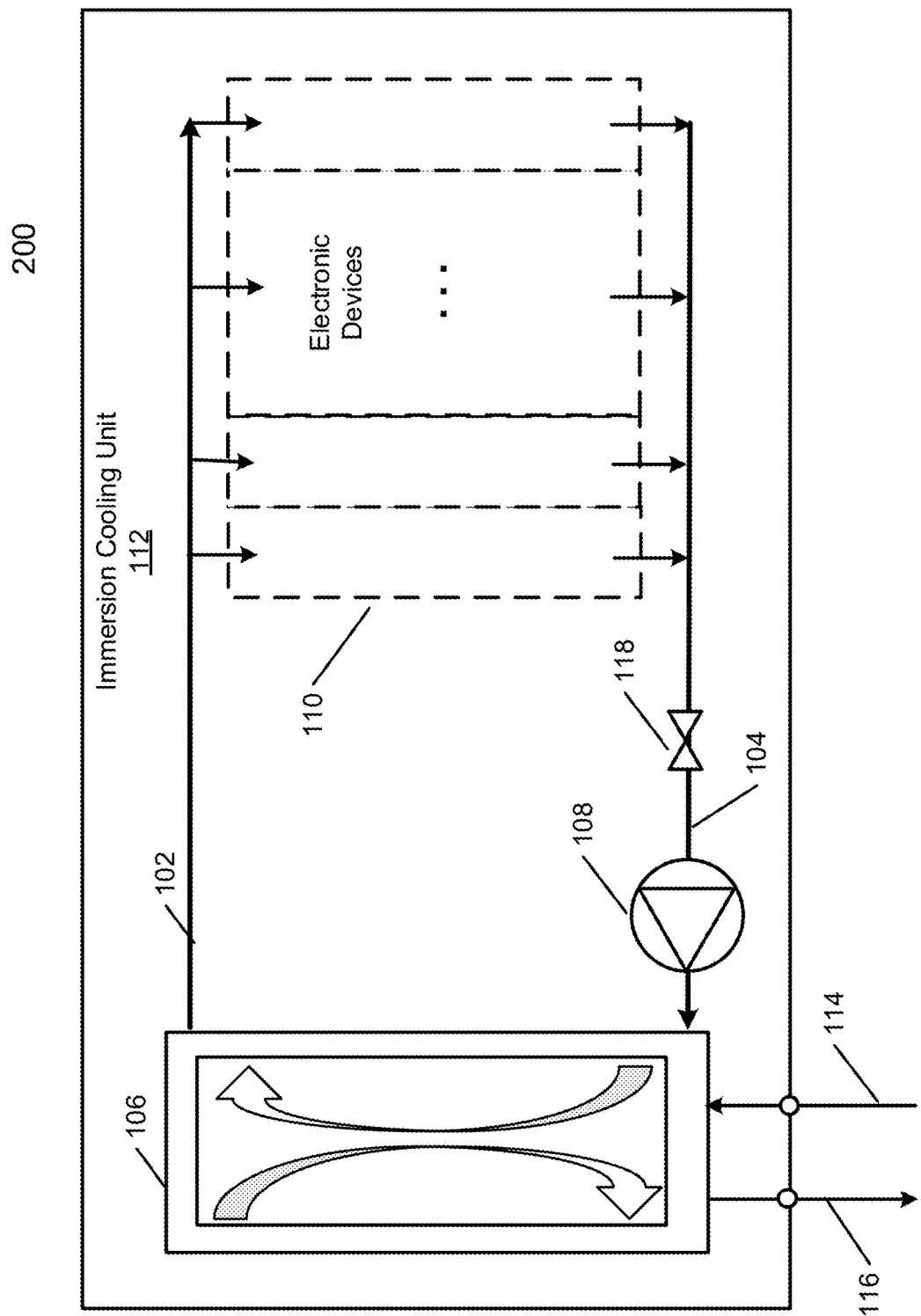
FIG. 2 is a block diagram illustrating an example of a data center system with immersion cooling according to another embodiment.

Referring to FIG. 2, a block diagram illustrating an example of a data center system 200 with immersion cooling according to one embodiment is shown. FIG. 2 illustrates the same or similar elements, such as the unit 112, the coolant supply line 102, the coolant return line 104, the heat exchanger 106, the liquid pump 108, the valve 118, the immersion cooling area 110, the external coolant supply line/port 114, and the external coolant return line/port 116, as FIG. 1. The detailed description of the same elements is not repeated here. In this embodiment, as illustrated in FIG. 2, the heat exchanger 106 may also be submerged in the coolant. That is, both the electronic devices and the heat exchanger 106 are submerged in the coolant. Either the heat exchanger 106 submerged or not, the concept is designing the entire immersion cooling secondary loop and tank as one modular unit.

Figure 3:
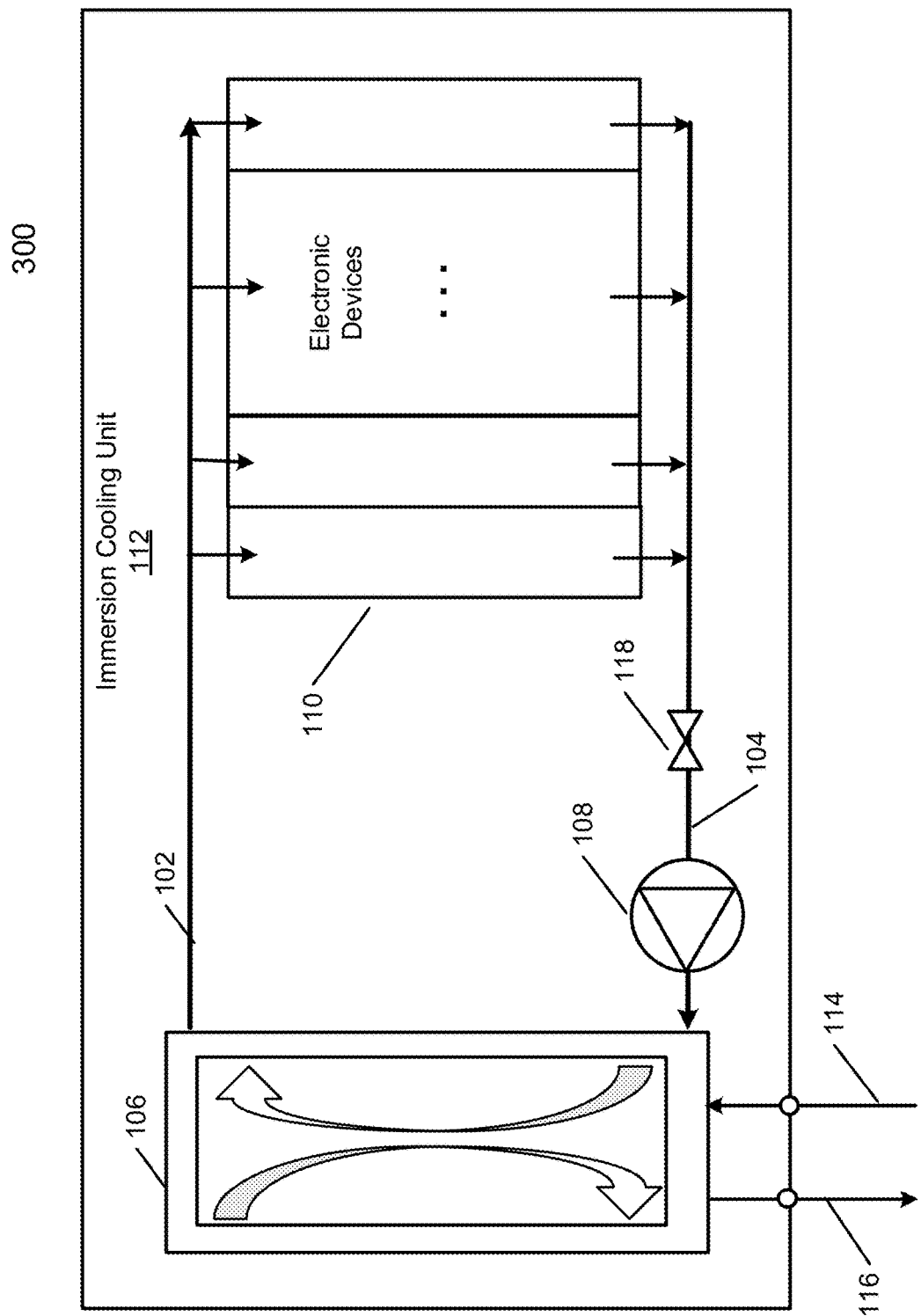
FIG. 3 is a block diagram illustrating an example of a data center system with immersion cooling according to another embodiment.

Referring now to FIG. 3, a block diagram illustrating an example of a data center system 300 with immersion cooling according to one embodiment is shown. FIG. 3 illustrates the same or similar elements, such as the unit 112, the coolant supply line 102, the coolant return line 104, the heat exchanger 106, the liquid pump 108, the valve 118, the immersion cooling area 110, the external coolant supply line/port 114, and the external coolant return line/port 116, as FIG. 1. The detailed description of the same elements is not repeated here. FIG. 3 is different from FIG. 2 in that the heat exchanger 106 is not submerged in the coolant, and the immersion cooling area 110 is a self-contained area, e.g., contained within an immersion tank containing the electronic devices and coolant therein. Separating the heat exchanger 106 from the immersion cooling area 110 may be appropriate when these components are, for example, covered under different service level agreements.

In addition, according to one embodiment, the immersion cooling area 110 may be partitioned into a number of subareas or slots, each corresponding to a subset of one or more electronic devices such as a server blade. A server blade refers to a server chassis containing one or more servers running therein, each server including one or more processors or processor cores and respective memory and storage, etc. configured to provide data services (e.g., data processing, cloud computing, platform as a service or PaaS) to a variety of client over a network (e.g., cloud server over the Internet). The processors, memory, and/or storage devices, when operate, may generate heat. As the servers are submerged into the coolant, the heat generated from the server may be removed by the coolant flowing through, which in turn lowers the temperature of the server.

Furthermore, according to another embodiment, each partition or slot may be separated using an individual container or wall, where the coolant volume and/or flow rate can be individually controlled dependent upon the ambient temperature of the corresponding partition or slot. The coolant volume and flow rate of each partition or slot can be controlled using an individual pump, valve, and/or temperature sensor as a part of control logic for controlling the corresponding slot (not shown). This configuration is particularly useful when the servers operate at different workload levels. Servers with different workloads may generate different amounts of heat, and their operating temperatures may be different that require different levels of cooling services in order to maintain the corresponding temperature within a reasonable range.

Figure 4:
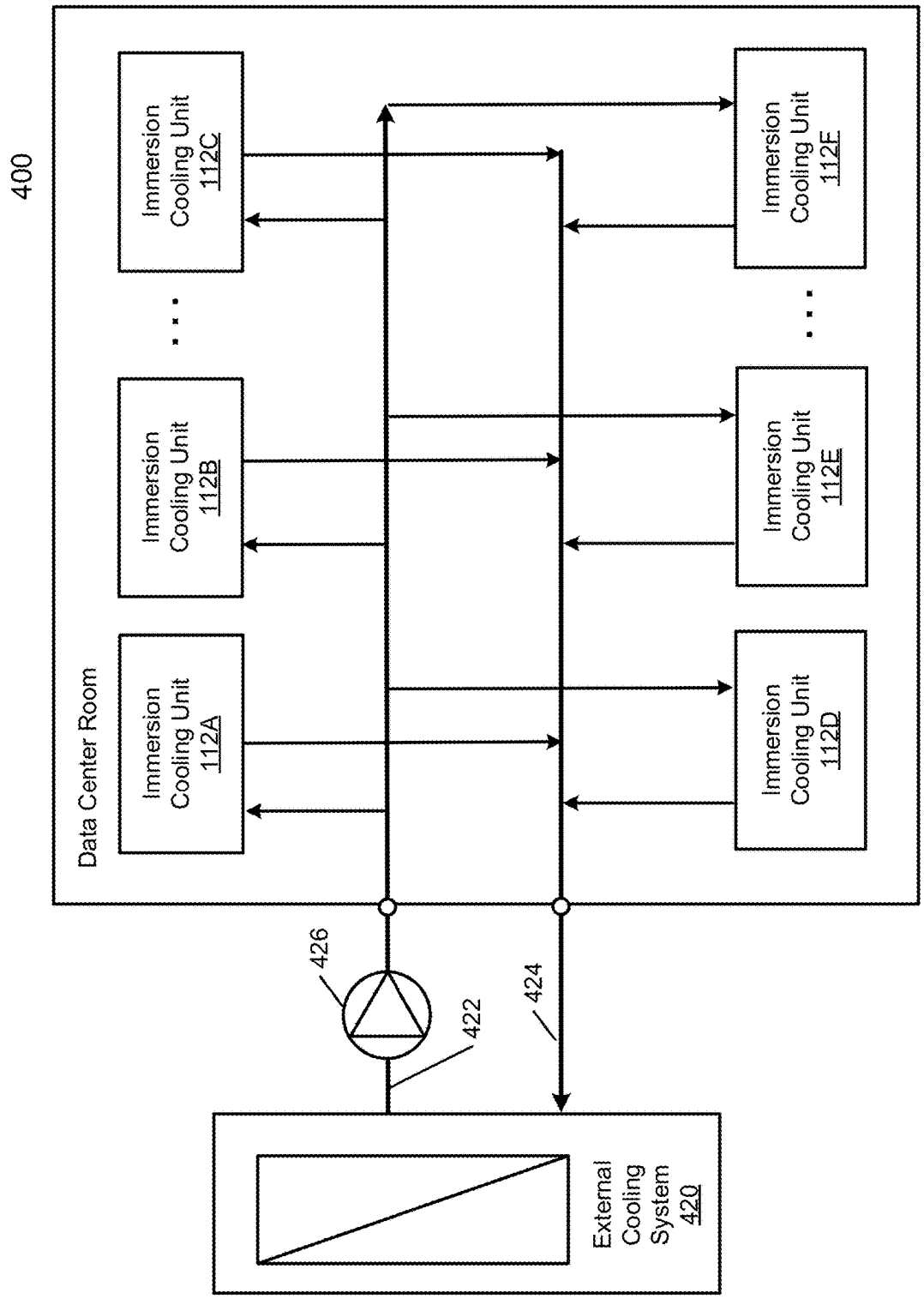
FIG. 4 is a block diagram illustrating an example of a data center system with immersion cooling according to another embodiment.

Referring to FIG. 4, a block diagram illustrating an example of data center system 400 with immersion cooling according to one embodiment is shown. A number of immersion units 112A-112F is installed in a data center environment or data center room. A data center may include one or more of these data center rooms. Although six immersion units are illustrated in FIG. 4, the number of units 112A-112F is illustrative only, and does not limit the disclosure. Each of immersion cooling units 112A-112F may represent to immersion cooling unit 112 illustrated in FIG. 1, and may comprise a coolant supply line, a coolant return line, a heat exchanger, a liquid pump, a valve, an immersion cooling area, an external coolant supply port, and an external coolant return port, etc. as described above. The detailed description of the same elements is not repeated here.

An external coolant supply line 422 (also referred to as a room coolant supply line or room coolant supply manifold) supplies the cooler external coolant to each of the immersion cooling units 112A-112F through the respective external coolant supply port from an external heat exchanger 420, and an external coolant return line 424 returns the warmer external coolant from the respective external coolant return port of each of the immersion cooling units 112A-112F to the external heat exchanger 420. Each of the immersion cooling units 112A-112F may be connected to or disconnected from room coolant supply line 422 and room coolant return line 424, for example, using quick release connectors in a plug and play manner. In addition, the main supply line 433 and return line 424 can be designed using a single loop (ring main) pipe network manner.

The heat in the external coolant is extracted at the external heat exchanger 420, and the warmer external coolant is transformed into the cooler external coolant. The external heat exchanger 420 may be a heat exchanger of any suitable type (e.g., a liquid-to-liquid heat exchanger, a liquid-to-air heat exchanger, etc.) The external heat exchanger 420 may also be connected to one or more other data center rooms containing one or more immersion cooling units as described above. An external liquid pump 426 may be disposed on the external coolant supply line 422 to facilitate the circulation of the external coolant. Thus, the external coolant may circulate in a closed loop: the cooler coolant absorbs heat from the warmer coolant in the heat exchangers 106, and turns into warmer external coolant. The warmer external coolant is cooler in the external heat exchanger 420, and is transformed back into the cooler external coolant.

As shown in FIG. 4, immersion cooling units 112A-112F can be used with existing data center cooling infrastructure. The external coolant loop may correspond to an existing cooling water loop that utilizes a cooling tower or a dry cooler as the external heat exchanger, or may correspond to an existing chilled water loop utilizing a chiller as the external heat exchanger.

Figure 5:
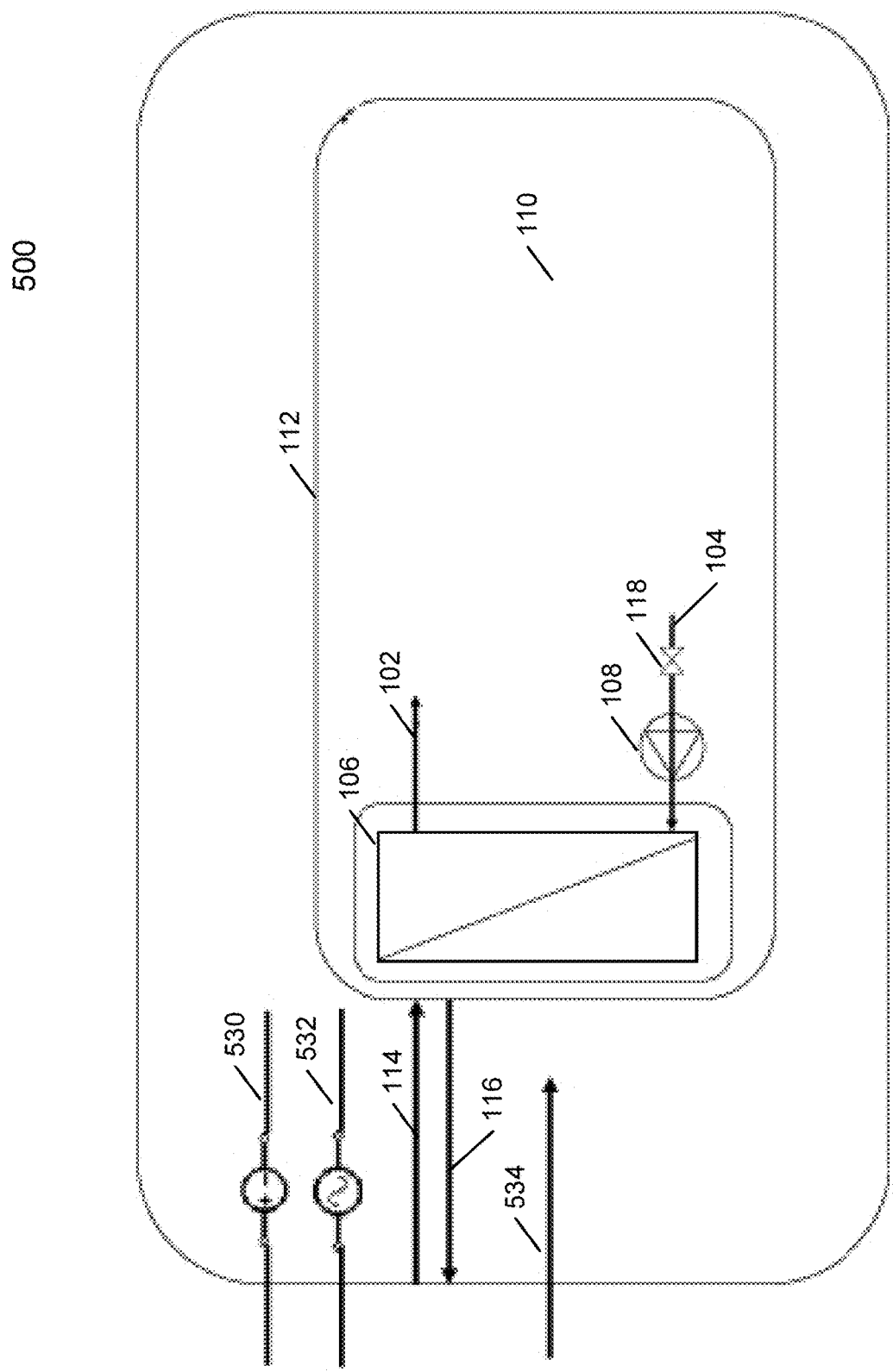
FIG. 5 is a block diagram illustrating an example of a data center system with immersion cooling according to another embodiment.

Referring to FIG. 5, a block diagram illustrating an example of a data center system 500 with immersion cooling according to one embodiment is shown. Immersion cooling unit 112 may represent the unit 112 illustrated in FIG. 1, and may include an coolant supply line 102, an coolant return line 104, an heat exchanger 106, a liquid pump 108, a valve 118, an immersion cooling area 110, an external coolant supply line/port 114, and an external coolant return line/port 116. The detailed description of the same elements is not repeated here.

As shown in FIG. 5, the immersion cooling unit 112 may be installed as one of the numerous immersion cooling units arranged in a computer room environment, e.g., a data center room. Although it may be a small computer room, a large number of devices with high power consumption may be installed within the unit 112 due to the superior cooling capability of the immersion cooling-based solution. No modification to the computer room is required. Or the system can be deployed in a regular office space. An external coolant source may be connected to the unit through the external coolant supply line/port 114 and the external coolant return line/port 116. Once a direct current (DC) power source 530 and/or an alternating current (AC) power source 532, a network source 534, and the external coolant source are connected, the devices can start normal operation.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion cooling unit, comprising: an immersion cooling area to contain one or more electronic devices that require cooling, the electronic devices being submerged in coolant; a heat exchanger, wherein the heat exchanger is submerged in the coolant; an entire immersion cooling loop including a coolant supply line and coolant return line loop as well as a liquid pump and valve are submerged in the coolant, wherein the coolant supply line is configured to supply cooler coolant from the heat exchanger to the immersion cooling area; the coolant return line is configured to return warmer coolant from the immersion cooling area to the heat exchanger; and the liquid pump disposed on the coolant return line is configured to circulate the coolant between the heat exchanger and the immersion cooling area to transform the coolant between the cooler coolant and the warmer coolant, wherein the cooler coolant exchanges heat generated from the electronic devices in the immersion cooling area and transforms into the warmer coolant, wherein heat is extracted from the warmer coolant in the heat exchanger and transferred to external coolant, and wherein the heat exchanger, the coolant supply line, and the coolant return line are packaged within a cooling unit container as a modular cooling unit.

2. The immersion cooling unit of claim 1, further comprising the valve disposed on the coolant return line to control a flow rate of the coolant flowing within the heat exchanger.

3. The immersion cooling unit of claim 1, wherein the heat exchanger is a liquid-to-liquid heat exchanger.

4. The immersion cooling unit of claim 1, wherein the coolant is a thermally conductive dielectric liquid.

5. The immersion cooling unit of claim 1, further comprising an external coolant supply port and an external coolant return port to connect a primary loop of the heat exchanger to an external cooling system.

6. The immersion cooling unit of claim 5, wherein the immersion cooling unit is one of a plurality of immersion cooling units of a data center coupled to the external cooling system, and wherein each of the immersion cooling unit can be individually connected to or disconnected from the external cooling system.

7. A data center cooling system, comprising: a room cooling system; a plurality of immersion cooling units; a room coolant supply line coupled to the room cooling system to supply room coolant to the immersion cooling units; and a room coolant return line coupled to the room cooling system to return the room coolant from the immersion cooling units to the room cooling system for heat exchange, wherein each of the immersion cooling unit comprises an immersion cooling area to contain one or more electronic devices that require cooling, the electronic devices being submerged in coolant, a heat exchanger, wherein the heat exchanger is submerged in the coolant; an entire immersion cooling loop including a coolant supply line and coolant return line loop as well as a liquid pump and valve are submerged in the coolant, wherein the coolant supply line is configured to supply cooler coolant from the heat exchanger to the immersion cooling area, the coolant return line is configured to return warmer coolant from the immersion cooling area to the heat exchanger, and the liquid pump disposed on the coolant return line is configured to circulate the coolant between the heat exchanger and the immersion cooling area to transform the coolant between the cooler coolant and the warmer coolant, wherein the cooler coolant exchanges heat generated from the electronic devices in the immersion cooling area and transforms into the warmer coolant, wherein heat is extracted from the warmer coolant in the heat exchanger and transferred to external coolant, and wherein the heat exchanger, the coolant supply line, and the coolant return line are packaged within a cooling unit container as a modular cooling unit.

8. The data center cooling system of claim 7, wherein each immersion cooling unit further comprises the valve disposed on the coolant return line to control a flow rate of the coolant flowing within the heat exchanger.

9. The data center cooling system of claim 7, wherein the heat exchanger is a liquid-to-liquid heat exchanger.

10. The data center cooling system of claim 7, wherein the coolant is a thermally conductive dielectric liquid.

11. The data center cooling system of claim 7, wherein each immersion cooling unit further comprises an external coolant supply port and an external coolant return port to connect a primary loop of the heat exchanger to an external cooling system.

12. The data center cooling system of claim 11, wherein the immersion cooling unit is one of a plurality of immersion cooling units of a data center coupled to the external cooling system, and wherein each of the immersion cooling unit can be individually connected to or disconnected from the external cooling system.

* * * * *